US009726738B2

(12) United States Patent
Weinberg et al.

(10) Patent No.: US 9,726,738 B2
(45) Date of Patent: Aug. 8, 2017

(54) ENERGY-SAVING METHOD OF GENERATING TIME-VARYING MAGNETIC GRADIENTS FOR USE IN MRI

(71) Applicant: WEINBERG MEDICAL PHYSICS LLC, Bethesda, MD (US)

(72) Inventors: Irving N. Weinberg, Bethesda, MD (US); Aleksandar Nelson Nacev, Bethesda, MD (US)

(73) Assignee: Weinberg Medical Physics Inc., North Bethesda, MD (US)

( * ) Notice: Subject to any disclaimer, the term of this patent is extended or adjusted under 35 U.S.C. 154(b) by 526 days.

(21) Appl. No.: 14/312,023

(22) Filed: Jun. 23, 2014

(65) Prior Publication Data

US 2014/0375315 A1    Dec. 25, 2014

Related U.S. Application Data

(60) Provisional application No. 61/837,854, filed on Jun. 21, 2013.

(51) Int. Cl.
*G01V 3/00* (2006.01)
*G01R 33/383* (2006.01)
*G01R 33/385* (2006.01)

(52) U.S. Cl.
CPC .......... *G01R 33/383* (2013.01); *G01R 33/385* (2013.01)

(58) Field of Classification Search
CPC .................................................. G01R 33/383
USPC ........................................ 324/318, 322, 319
See application file for complete search history.

(56) References Cited

U.S. PATENT DOCUMENTS

| 5,415,163 | A | 5/1995 | Harms et al. |
| 5,442,290 | A | 8/1995 | Crooks |
| 6,107,797 | A * | 8/2000 | Sezginer .............. G01N 24/081 324/303 |
| 6,150,821 | A | 11/2000 | Mori et al. |
| 6,704,594 | B1 | 3/2004 | Blank et al. |
| 7,535,229 | B2 * | 5/2009 | Schlueter ............. G01R 33/381 324/307 |
| 7,859,260 | B2 | 12/2010 | Reiderman |
| 8,154,286 | B2 | 4/2012 | Weinberg |
| 8,466,680 | B2 | 6/2013 | Weinberg et al. |
| 8,836,329 | B2 | 9/2014 | Weinberg |
| 2009/0149735 | A1 | 6/2009 | Fallone et al. |
| 2009/0251141 | A1 | 10/2009 | Baumgartl et al. |
| 2010/0295641 | A1 | 11/2010 | Schild et al. |
| 2011/0068791 | A1 | 3/2011 | Weinberg |

(Continued)

FOREIGN PATENT DOCUMENTS

| JP | 2-46827 | 2/1990 |
| WO | 2009155522 A1 | 12/2009 |

OTHER PUBLICATIONS

Notification of Transmittal of the International Search Report and the Written Opinion of the International Searching Authority, or the Declaration for PCT/US2009/047960, Filed Jun. 19, 2009.

(Continued)

*Primary Examiner* — Louis Arana
(74) *Attorney, Agent, or Firm* — Barnes & Thornburg LLP

(57) ABSTRACT

An apparatus and method which produce a magnetic field gradient by physically rotating one or more permanent magnets near an object in order to obtain images of the object.

13 Claims, 2 Drawing Sheets

(56) References Cited

U.S. PATENT DOCUMENTS

2016/0216353 A1* 7/2016 Heinen ................ A61B 5/0035

OTHER PUBLICATIONS

Supplementary European Search Report Application No. 09 76 7831, dated Jun. 9, 2011.
Conradi, "Generation of Short, Intense Gradient Pulses", Journal of Magnetic Resonance vol. 94, No. 2, (1991), pp. 370-375.
Mueller et al., "A High-Efficiency 4-Switch GOT Speed-Up Inverter for the Generation of Fast-Changing MRI Gradient Fields", pp. 806-812.
Zupanete et al., "Coils Producing a Magnetic Field Gradient for Diffusion Measurements With NMR", pp. 79-80.
Riepe, "High-Voltage Microsecond Pulse-Forming Network", pp. 1028-1030.
Bauer et al., "Innovative Efficient Gradient Coil Driver Toplogy," IEEE, (2004), pp. 1838-1843.
Sanders et al., "High Power Solid State Switch Module", IEEE, (2004), pp. 563-566.
Reichert et al., "Magnetic Rsonance Imaging of Cortical Bone With Ultrashort TE Pulse Sequences", Magnetic Resonance Imaging, 23, (2005), pp. 611-618.
International Standard, "Particular Requirement for the Basic Safety and Essential Performance of Magnetic Resonance Equipment for Medical Diagnosis", (2010), p. 1-224.
ICNIRP Guidelines, "For Limiting Exposure to Time-Varying Electric, Magnetic and Electromagnetic Fields," Health Physics 74(4), pp. 493-523.
Reilly, "Maximum Pulsed Electromagnetic Field Limits Based on Peripheral Nerve Stimulation: Application to IEEE/ANSI C95.1 Electromagnetic Field Standards," IEEE Transactions on Biomedical Engineering, vol. 45, No. 1, (1998), pp. 137-141.
Bertora et al., "Transversal Gradient Compensation in Three-Sided MRI Magnets," Robotics, Brain and Cognitive Sciences, Italian Institute of Technology, (2009) p. 3056.
Vogt et al., "Increased Time Rate of Change of Gradient Fields: Effect on Peripheral Nerve Stimulation at Clinical MR Imaging", Radiology, (2004), pp. 548-554.
Joachim et al., "Peripheral Nerve Stimulation by Time-Varying Magnetic Fields Journal of Computer Assisted Tomography", vol. 21(4), (1997), pp. 532-538.
Glover, "Interaction of MRI Field Gradients With the Human Body", Phys. Med. Biol. vol. 54, (2009), pp. R99-R115.
Harvey et al., "Avoiding Peripheral Nerve Stimulation: Gradient Waveform Criteria for Optimum Resolution in Echo-Planar Imaging", MRM, (1994), pp. 236-241.

\* cited by examiner

ENERGY-SAVING METHOD OF GENERATING TIME-VARYING MAGNETIC GRADIENTS FOR USE IN MRI

CROSS REFERENCE

This application relies for priority on U.S. Provisional Application No. US 61/837,854, filed Jun. 21, 2013, and entitled "Energy-Saving Method of Generating Time-Varying Magnetic Gradients for Use in MRI", the contents of which are incorporated herein by reference.

FIELD

The present invention applied to magnetic field generation for use in magnetic resonance imaging (MRI).

BACKGROUND

Classically, time-varying magnetic gradients are generated for use in MRI by applying currents to coils that are in the vicinity of a sample to be imaged. As a result of the large inductance of the coils, substantial energy is required to initialize the flow of these currents through the coils. If the magnetic gradients are rapidly activated, the voltage required to initiate current in the gradient coils can be high, leading to high voltage-handling requirements. Some of the current flowing through the gradient coils is wasted in the form of heat, which can deleteriously raise the temperature in nearby components or decrease the current flowing in the gradient coils. Additionally, the currents in the activated gradient coils can couple to other nearby coils. This coupling of nearby coils can heat those nearby coils, introduce unwanted gradient fields, or introduce additional radiofrequency (RF) noise.

As described in earlier patent applications by inventor Weinberg (application Ser. No. 13/439,382), it is possible to use fast MRI to image teeth or other solid objects. The free-induction decay (FID) of protons in teeth is rapid ($T_2$<50 microseconds), so in order to apply spatial localization pulses, the gradient fields must be rapidly applied. Traditional methods of gradient field applications would necessitate large power supplies capable of delivering significant currents in small intervals. In order to image teeth cost-effectively with MRI, it is preferable to minimize the power requirements of gradient coil activation.

SUMMARY

In disclosed embodiments, an apparatus and method are utilized which produce a magnetic field gradient by physically rotating one or more permanent magnets near an object in order to obtain images of the object.

BRIEF DESCRIPTION OF THE FIGURES

The invention will now be described in connection with the drawings appended hereto, in which.

DETAILED DESCRIPTION

Figure 1:
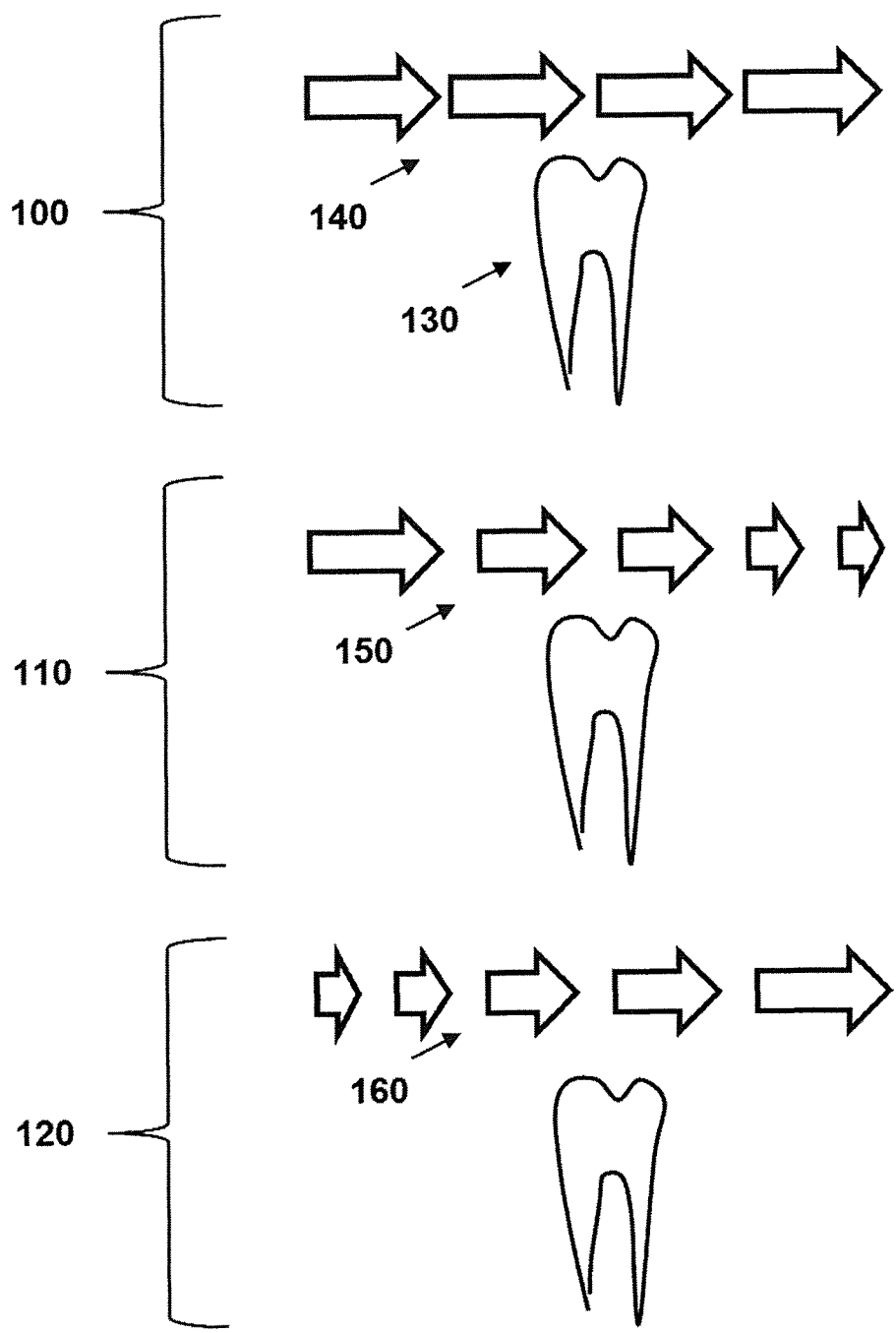
FIG. 1 illustrates one example of a methodology provided in accordance with the disclosed embodiments.

The method can be summarized as follows, and as illustrated in FIG. 1. FIG. 1 represents three successive operations of the disclosed embodiments, shown as 100, 110, and 120. The duration of time between operations 100 and 110 is sufficient to align the nuclear material within one or more objects of interest 130 with locally-uniform magnetic field 140. The duration of time between operations 110 and 120 is sufficient to produce an appropriate change in the nuclear gyromagnetic precession frequency or phase of polarizable components of the object (for example, protons or free electrons) for the purpose of spatial localization. For the purposes of this disclosure, polarizable components that may be imaged with MRI techniques are termed "spins". It is understood that the term "magnetic resonance imaging" typically refers to the description of the distribution of polarized protons in an object after excitation with radiofrequency (RF) energy. The term "magnetic resonance imaging" or MRI in this disclosure is used to encompass those typical descriptions, as well as other more general applications, for example the description of distribution of free radicals or magnetizable particles, whether excited by RF energy or other means (e.g., changes in magnetic configurations as a result of the local environment of the particles, as disclosed by Weinberg in patent application Ser. No. 14/221,777, entitled "Apparatus and Method for Spatially Selective Interventional Neuroparticles).

It should be understood that operations 100, 110, and 120 may be repeated many times, and in different directions. In the first operation 100 of one embodiment of the method, one or more objects 130 that contain protons with quickly decaying FIDs (e.g., a tooth) is exposed to a locally-uniform magnetic field 140. By locally-uniform it is meant that over the size of the object of interest, the magnetic field is relatively uniform (e.g., within 1%). In one embodiment, a RF pulse (not shown) is then introduced to excite a desired region of the object 130. A subsequent magnetic field gradient 150 is then introduced that changes the local magnetic field within the object 130. This change in the local magnetic field will then change the local gyromagnetic precession frequency. At a subsequent time point 120, a different magnetic field gradient 160 is applied. It is understood that combinations of various magnetic field gradients will be enough to a spatially locate the gyromagnetic precession of the object's protons.

In an alternative embodiment, the polarizing magnetic field 140 does not need to be uniform. The polarizing field can be designed to produce a magnetic field gradient that selects a region of interest within the object of interest when combined with appropriate RF transmitter and receiver arrays (not shown). In additional embodiments, it is possible to combine the polarizing and gradient fields into a single magnetic field application.

Figure 2:
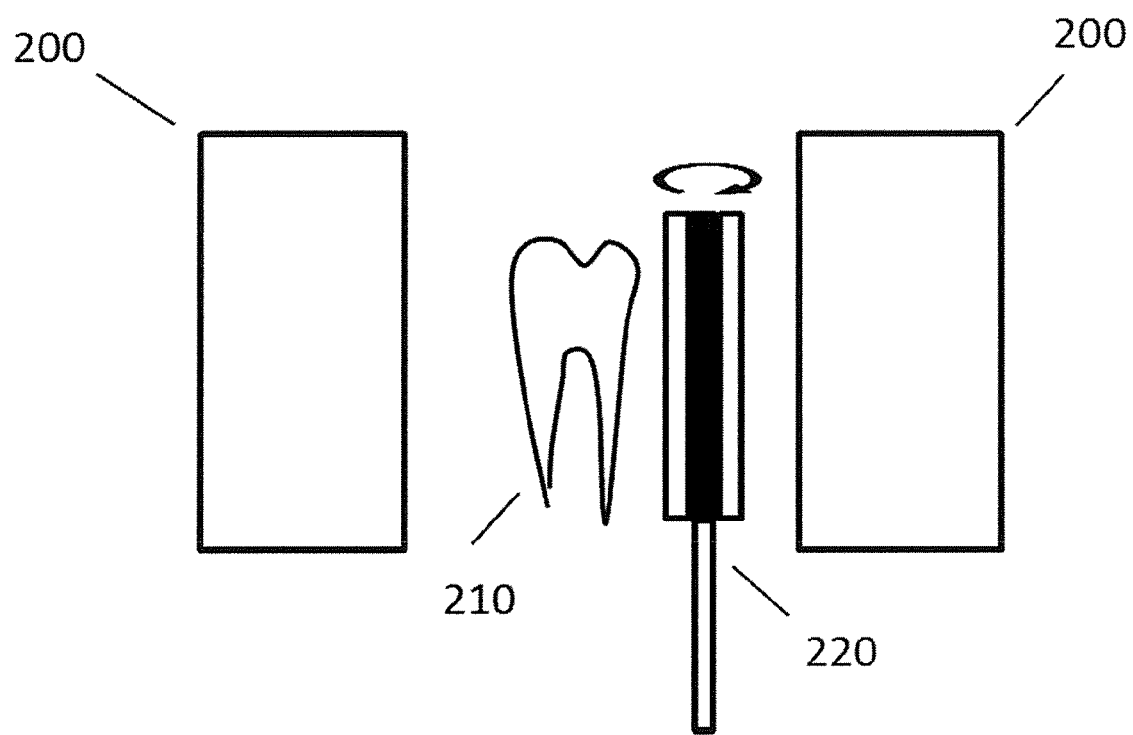
FIG. 2 represents a one-dimensional example of the invented apparatus used to implement the method shown in FIG. 1.

FIG. 2 represents a one-dimensional example of the invented apparatus used to implement the method shown in FIG. 1. Permanent magnetic poles 200 create a static field around an object 210, which in FIG. 2 is shown as a tooth, although other objects of interest are contemplated. A spinning array of permanent magnets 220 creates time-varying magnetic gradients in the region of the object 210. Other MRI components such as radiofrequency coils for generation and reception of signals from the object, amplifiers, and supplementary coils for generating magnetic fields are understood to potentially be useful or necessary in the MRI system contemplated by the invention, but are not explicitly included in the figure. The configuration of FIG. 2 demonstrates a simple array of permanent magnets 220. Other configurations of the permanent magnet arrays are understood to be needed in order to generate gradients yielding two- or three-dimensional images of the objects of interest, although such configurations are not explicitly included in the figure. Similarly, the motor or turbine or other driving mechanism to move the array of permanent magnets 220 are understood to be needed to move the permanent magnet array, but are not explicitly included in the figure. It is understood that a simple rotation of the permanent magnets may generate a sine-wave form of time-varying magnetic gradients, which may be reconstructed using spiral imaging or other image reconstruction methods.

In the apparatus illustrated in FIG. 2, time-varying magnetic gradients are applied to a region of space through rotation and/or translation of permanent magnets 220. These generated magnetic gradients may be in addition to, or in replacement of, magnetic gradients generated through current-carrying coil structures (not shown). The rotation of the permanent magnets may be rapid, which may be useful to generated fast magnetic gradients as may be useful for imaging teeth. Such rotation may be implemented with air turbines, which are used in the dental field for drilling. Some drills can operate at speeds near ten thousand of revolutions per second, which would result in magnetic gradients with rise times of less than 100 microseconds. Said fast rise times have been shown to result in reduction or elimination of bio-effects, as in the prior invention by Weinberg (U.S. Pat. No. 8,466,680).

It is understood that torques and forces from a static magnetic field could act upon the permanent magnets employed in the invention, and it is therefore contemplated that the permanent magnets shall be balanced in order to minimize the effects of said torques and forces. Alternatively, instead of permanent magnets 200, a pre-polarizing magnetic field may be applied by coils (not shown) prior to the application of the magnetic gradients, so that the effect of a static field is minimized or eliminated during the motion of permanent magnets 200. Alternatively, permanent magnets may be rapidly moved away from object of interest 210. Alternatively, a portion of magnet array 220 may act as a pole to polarize spins in object of interest 210, whereby the spinning motion of array 220 determines whether the magnetic field applied to object of interest 210 acts to polarize the spins in the object or to apply a spatially-localizing gradient to the spins in the object.

While the current embodiment uses air turbines to produce rotational motion of the permanent magnets that produce magnetic gradients, it is understood that other methods might be used. These include the use of acoustics to create translational vibrations of permanent magnetic assemblies, belts to couple neighboring gears to the rotational axis of the magnets, or a hydraulic apparatus made to produce rotation or translation of the magnet assembly.

It should be understood that the relative movement and operations performed by the disclosed equipment may be controlled using software stored in memory and/or running on one or more computer processors to provide the claimed functionality wherein magnetic resonance imaging is performed on at least one object of interest, and at least one rotating permanent magnet is manipulated to create a magnetic field in the at least one object of interest, wherein the rotational speed during at least some part of the imaging process is greater than 100 revolutions per second.

While the current embodiment shows the application of a nearby magnet assembly to create the magnetic gradient field, it is understood that this magnet assembly could encompass the entire object of interest. This magnet assembly could then be rotated around the entire object to generate a spatially localized FID signal.

It is understood that active or passive materials (for example, mu-metal, conducting plates, other magnets) may be placed in the vicinity of one or more components of the apparatus in order to reduce the effect of magnetic fields on nearby devices or objects.

What is claimed is:

1. An apparatus for magnetic resonance imaging of at least one object of interest, the apparatus comprising:
   a magnetic resonance imaging system for performing an imaging process to image the at least one object of interest, the magnetic resonance imaging system including at least one power source coupled to a processor that controls operation of the magnetic resonance imaging system to generate at least one magnetic field gradient and generate radio waves for application to the at least one object of interest to elicit an electromagnetic response from atoms and molecules included in the at least one object of interest, wherein the magnetic resonance imaging system includes at least one detector that detects the electromagnetic response and the processor generates the image of the at least one object of interest based on the detected electromagnetic response,
   wherein the apparatus includes at least one rotating permanent magnet that creates a magnetic field in the at least one object of interest,
   wherein the rotational speed of the at least one rotating permanent magnet during at least some part of the imaging process performed by the magnetic resonance imaging system is greater than 100 revolutions per second.

2. The apparatus of claim 1, further comprising a static permanent magnet that polarizes spins in the at least one object of interest.

3. The apparatus of claim 1, wherein the rotational speed of the at least one rotating permanent magnet during at least some part of the imaging process is greater than 1,000 revolutions per second.

4. The apparatus of claim 1, wherein the rotational speed of the at least one rotating permanent magnet during at least some part of the imaging process is greater than 10,000 revolutions per second.

5. The apparatus of claim 1, wherein bio-effects are eliminated through fast application of magnetic gradients.

6. The apparatus of claim 1, wherein the rotational speed of the at least one rotating permanent magnet varies during the imaging process.

7. The apparatus of claim 1, wherein rotation of the at least one rotating permanent magnet is caused through application of compressed air or fluid.

8. The apparatus of claim 1, wherein the at least one object of interest is stationary.

9. A method for performing a magnetic resonance imaging process to image at least one object of interest, the method comprising:
   performing the magnetic resonance imaging process using a magnetic resonance imaging system, the imaging process including:
      controlling operation of the magnetic resonance imaging system to generate at least one magnetic field gradient and generate radio waves for application to the at least one object of interest to elicit an electromagnetic response from atoms and molecules included in the at least one object of interest;
      detecting the electromagnetic response;

generating the image of the at least one object of interest based on the detected electromagnetic response; and rotating at least one permanent magnet in a vicinity of at least one object of interest to create a magnetic field in the at least one object of interest, wherein the rotational speed of the at least one rotating permanent magnet during at least some part of the imaging process performed by the magnetic resonance imaging system is greater than 100 revolutions per second.

10. The method of claim 9, wherein the speed of rotation attains at least 1,000 revolutions per second at some point during the imaging process.

11. The method of claim 9, wherein the speed of rotation attains at least 10,000 revolutions per second at some point during the imaging process.

12. The method of claim 9, wherein bio-effects are eliminated through the rapid application of magnetic gradients.

13. The method of claim 9, wherein the at least one object is stationary.

\* \* \* \* \*